United States Patent
Kodama

(10) Patent No.: US 9,587,874 B2
(45) Date of Patent: Mar. 7, 2017

(54) COOLING SYSTEM AND METHOD

(71) Applicant: FUJITSU LIMITED, Kawasaki-shi, Kanagawa (JP)

(72) Inventor: Hiroyoshi Kodama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 461 days.

(21) Appl. No.: 14/172,944

(22) Filed: Feb. 5, 2014

(65) Prior Publication Data

US 2014/0150480 A1    Jun. 5, 2014

Related U.S. Application Data

(63) Continuation of application No. PCT/JP2011/070739, filed on Sep. 12, 2011.

(51) Int. Cl.
*F25D 17/06*     (2006.01)
*F24F 11/00*     (2006.01)
*H05K 7/20*      (2006.01)

(52) U.S. Cl.
CPC ............ *F25D 17/06* (2013.01); *F24F 11/006* (2013.01); *H05K 7/20209* (2013.01);
(Continued)

(58) Field of Classification Search
CPC ................ H05K 7/20209; F24F 11/006; F24F 2011/0075; F24F 11/0079; Y02B 30/746; F25D 17/06
See application file for complete search history.

(56) References Cited

U.S. PATENT DOCUMENTS

2005/0278070 A1* 12/2005 Bash .................. H05K 7/20836
                                                      700/276
2006/0100744 A1*  5/2006 Sharma ............... F24F 11/0008
                                                      700/276
(Continued)

FOREIGN PATENT DOCUMENTS

EP        2169328       3/2010
JP        6-82052       3/1994
(Continued)

OTHER PUBLICATIONS

Japanese Office Action mailed Nov. 25, 2014 for corresponding Japanese Patent Application No. 2013-533356, with Partial English Translation, 5 pages.
(Continued)

*Primary Examiner* — Allana Lewin Bidder
*Assistant Examiner* — Kun Kai Ma
(74) *Attorney, Agent, or Firm* — Fujitsu Patent Center

(57) ABSTRACT

A cooling system includes an air conditioner capable of cooling a predetermined space and changing an air volume or set temperature; one or more electronic devices disposed in the predetermined space and including a fan of variable rotational speed; a temperature sensor configured to detect temperature of the electronic devices; and a control apparatus configured to select, based on an increase in the detected temperature, whether to increase the air volume or decrease the set temperature of the air conditioner or to increase the rotational speed of the fan, with reference to air-conditioner information indicating a relationship between cooling performance and power consumption of the air conditioner and fan information indicating a relationship between cooling performance and power consumption of the fan.

6 Claims, 13 Drawing Sheets

(52) U.S. Cl.
CPC ... *F24F 11/0079* (2013.01); *F24F 2011/0075* (2013.01); *Y02B 30/746* (2013.01)

(56) References Cited

U.S. PATENT DOCUMENTS

| | | | | |
|---|---|---|---|---|
| 2008/0232974 A1* | 9/2008 | Tsuchiya | G06F 1/20 | 417/14 |
| 2008/0239688 A1* | 10/2008 | Casey | H05K 7/20563 | 361/796 |
| 2009/0099696 A1* | 4/2009 | Artman | G06F 1/206 | 700/276 |
| 2009/0150133 A1* | 6/2009 | Archibald | G06F 17/5009 | 703/9 |
| 2009/0205416 A1* | 8/2009 | Campbell | G01F 1/34 | 73/202.5 |
| 2010/0100254 A1* | 4/2010 | Artman | H05K 7/20836 | 700/299 |
| 2010/0134972 A1* | 6/2010 | Moss | H05K 7/20736 | 361/679.49 |
| 2010/0194321 A1* | 8/2010 | Artman | G06F 1/206 | 318/454 |
| 2010/0298997 A1* | 11/2010 | Ohba | H05K 7/20836 | 700/291 |
| 2010/0317278 A1* | 12/2010 | Novick | H05K 7/20836 | 454/184 |
| 2011/0057803 A1* | 3/2011 | Yamaoka | H05K 7/20836 | 340/584 |

FOREIGN PATENT DOCUMENTS

| | | |
|---|---|---|
| JP | 11-132508 A | 5/1999 |
| JP | 2006-64253 | 3/2006 |
| JP | 2007-148572 | 6/2007 |
| JP | 2007-300037 | 11/2007 |
| JP | 2008-235696 | 10/2008 |
| JP | 2009-140421 | 6/2009 |
| JP | 2009-217500 | 9/2009 |
| JP | 2010-85011 | 4/2010 |
| JP | 2010-108324 | 5/2010 |
| JP | 2010-244543 | 10/2010 |
| JP | 2010-270937 | 12/2010 |

OTHER PUBLICATIONS

International Search Report, mailed in connection with PCT/JP2011/070739 and mailed Dec. 13, 2011.

\* cited by examiner

| ΔT(°C) | 1.0 | 2.0 | 3.0 | 4.0 | 5.0 |
|---|---|---|---|---|---|
| ΔW(W): AIR-CONDITIONER | 20 | 40 | 60 | 80 | 100 |
| ΔW(W): FANS | 0.8 | 6.4 | 21.6 | 51.2 | 100 |

| PATTERN | 1 | 2 | 3 | 4 | 5 | 6 | 7 | 8 | 9 | 10 | 11 |
|---|---|---|---|---|---|---|---|---|---|---|---|
| Sall | ← | → | ← | ← | ← | → | → | – | – | → | → |
| Tall | – | – | → | → | ← | → | → | ← | → | ← | ← |
| PUE | INCREASE | INCREASE | DECREASE | DECREASE | INCREASE | DECREASE | INCREASE | INCREASE | DECREASE | INCREASE | INCREASE |
| Pall | INCREASE | DECREASE | DECREASE | INCREASE | INCREASE | DECREASE | DECREASE | INCREASE | DECREASE | INCREASE | DECREASE |

FIG. 13

COOLING SYSTEM AND METHOD

CROSS-REFERENCE TO RELATED APPLICATION

This application is a continuation application of International Application PCT/JP2011/070739 filed on Sep. 12, 2011 which designated the U.S., the entire contents of which are incorporated herein by reference.

FIELD

The embodiments discussed herein are related to a cooling system and method for cooling electronic devices.

BACKGROUND

A data center, for example, contains a large number, generally thousands or tens of thousands, of electronic devices such as server computers and switches. To cool the electronic devices, an air conditioner is installed in the data center.

It is sometimes the case that the temperature on the air conditioner is set lower to provide a margin so that even if, for example, the temperature of the electronic devices temporarily increases due to increased load on the electronic devices, the increased temperature does not exceed an acceptable level. In this case, the electronic devices are excessively cooled while the load of the electronic devices is comparatively low, and excessive use of the air conditioner increases the power consumption of the data center.

In view of this problem, to reduce the power consumption of the air conditioner, a technology has been proposed in which the electronic devices are cooled, for example, by detecting the temperature of the electronic devices and controlling the output level of the air conditioner based on the detected temperature.

Another proposed technology presenting a different method of cooling electronic devices is designed to cool servers, for example, by disposing evaporators adjacent to the servers and using heat generated by the servers to vaporize a refrigerant of the evaporators.

Japanese Laid-open Patent Publication No. 2006-64253
Japanese Laid-open Patent Publication No. 2010-270937
Japanese Laid-open Patent Publication No. 2009-217500

Such electronic devices may be equipped with fans, such as intake fans for taking air into chassis of the electronic devices and exhaust fans for exhausting air out of the chassis. The rotation of the fans provided in the electronic devices is controlled, for example, by firmware operating on the electronic devices.

However, no conventional technologies as described above have adopted, for their cooling control of electronic devices, the concept of using the fans provided in the electronic devices to cool the electronic devices.

SUMMARY

According to one embodiment, there is provided a cooling system including an air conditioner configured to be capable of cooling a predetermined space and changing an air volume or a set temperature thereof; one or more electronic devices disposed in the predetermined space and provided with a fan whose rotational speed is variable; a temperature sensor configured to detect temperature of the one or more electronic devices; and a control apparatus configured to select, based on an increase in the temperature detected by the temperature sensor, whether to increase the air volume or decrease the set temperature of the air conditioner or to increase the rotational speed of the fan, with reference to air-conditioner information indicating a relationship between cooling performance and power consumption of the air conditioner and fan information indicating a relationship between cooling performance and power consumption of the fan, and control the air volume or the set temperature of the air conditioner and the rotational speed of the fan based on which to select whether to increase the air volume or decrease the set temperature of the air conditioner or to increase the rotational speed of the fan.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 illustrates an example of air-conditioner/fan information according to the second embodiment;

FIG. 13 illustrates a relationship among Sall, Tall, PUE, and Pall.

DESCRIPTION OF EMBODIMENTS

Embodiments are described below with reference to the accompanying drawings.

(a) First Embodiment

Figure 1:
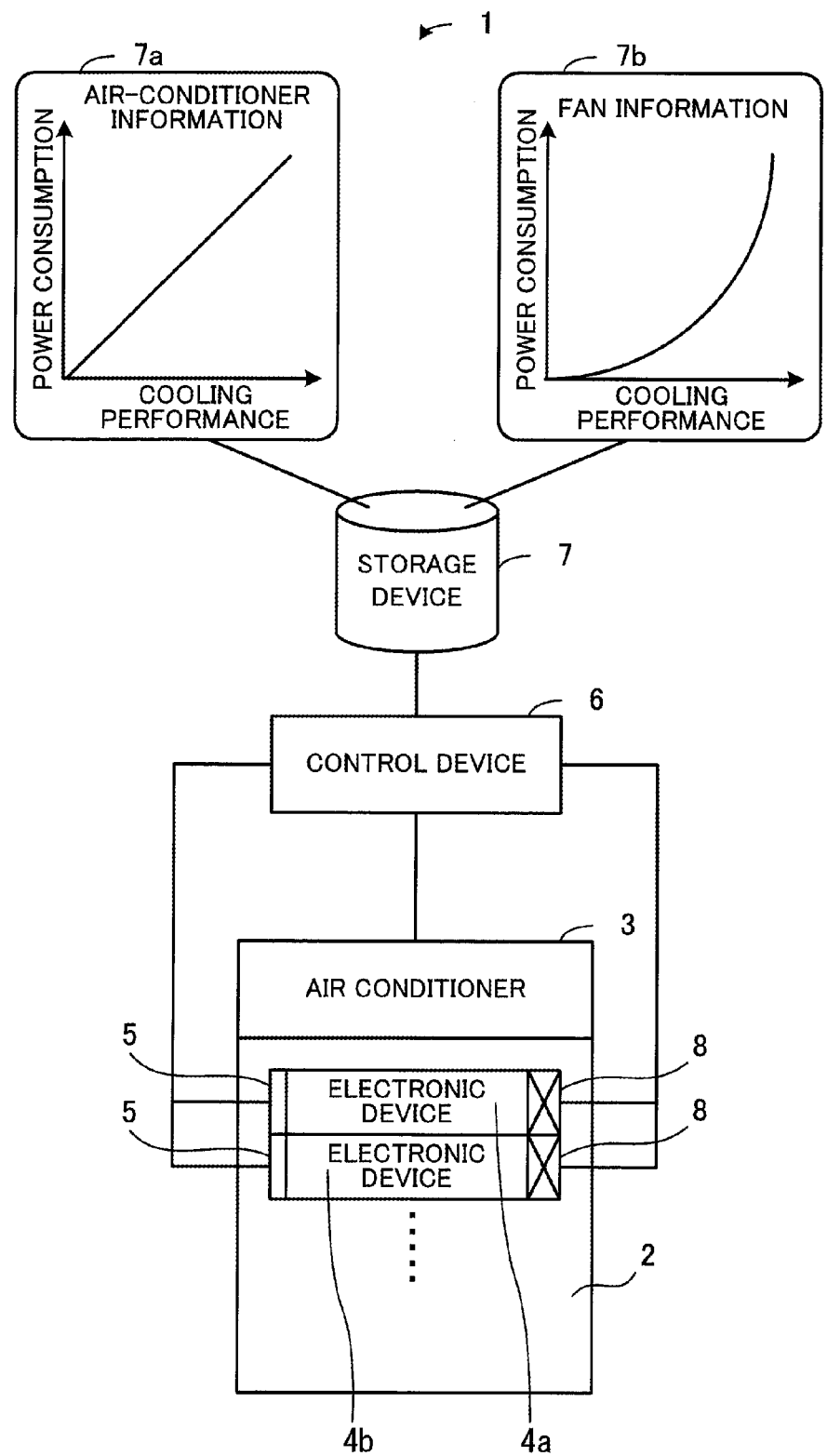
FIG. 1 illustrates an example of a cooling system according to a first embodiment.

FIG. 1 illustrates an example of a cooling system according to a first embodiment. A cooling system 1 includes an air conditioner 3, electronic devices 4a, 4b and so on, temperature sensors 5, a control device 6, and a storage device 7.

The air conditioner 3 is installed in a predetermined space 2 to cool the predetermined space 2. The air conditioner 3 is capable of changing its output level (air volume or set temperature) according to an instruction of the control device 6.

The electronic devices 4a, 4b and so on are installed in the predetermined space 2. The electronic devices 4a, 4b and so on are, for example, IT (information technology) devices such as servers. Each of the electronic devices 4a, 4b and so on is provided with a fan 8 whose rotation level (rotational speed) is variable according to an instruction from the control device 6.

Each of the temperature sensors 5 is installed in one of the electronic devices 4a, 4b and so on to detect the temperature of the electronic device.

The storage device 7 stores therein air-conditioner information 7a indicating a relationship between the cooling performance and the power consumption of the air conditioner 3 and fan information 7b indicating a relationship between the cooling performance and the power consumption of the fans 8.

The cooling performance and the power consumption of the air conditioner 3 have a proportional relationship, for example. On the other hand, as for the relationship between the cooling performance and the power consumption of the fans 8, for example, the rate of increase in the power consumption becomes larger to achieve higher cooling performance (i.e., a higher rotation level).

In this case, while only comparatively low cooling performance is needed because a rise in the temperature of the electronic devices 4a, 4b and so on is small, the power consumption may be reduced by increasing the rotation level of the fans 8 rather than increasing the output level of the air conditioner 3. On the other hand, when comparatively high cooling performance is needed because a rise in the temperature of the electronic devices 4a, 4b and so on is large, the power consumption may be reduced by increasing the output level of the air conditioner 3 rather than increasing the rotation level of the fans 8. That is, the magnitude relationship between the power consumption of the air conditioner 3 and the power consumption of the fans 8 may change depending on desired cooling performance.

Based on an increase in the temperature detected by the temperature sensors 5, the control device selects which one of the output level of the air conditioner 3 and the rotation level of the fans 8 to be raised with reference to the air-conditioner information 7a and the fan information 7b stored in the storage device 7. Then, based on the selection result, the control device 6 controls the output level of the air conditioner 3 and the rotation level of the fans 8.

For example, based on the air-conditioner information 7a and the fan information 7b, the control device 6 calculates a selection rule for selecting which one of the output level of the air conditioner 3 and the rotation level of the fans 8 to be raised according to the increase in the temperature detected by the temperature sensors 5. Subsequently, the control device 6 controls the output level of the air conditioner 3 and the rotation level of the fans 8 according to the calculated selection rule and the temperature detected by the temperature sensors 5.

In addition, the control device 6 calculates an index value indicating operational efficiency of the electronic devices 4a, 4b and so on, for example, from the power consumption of the air conditioner 3 and the power consumption of the electronic devices 4a, 4b and so on, and then adjusts the selection rule based on the calculated index value.

Next described is a cooling procedure implemented by the cooling system 1. Assume here that the air-conditioner information 7a and the fan information 7b are stored in the storage device 7. Note however that the air-conditioner information 7a and the fan information 7b may be dynamically generated by measuring the temperature and power consumption at each point in time.

The control device 6 detects the temperature of the electronic devices 4a, 4b and so on using the temperature sensors 5. The control device 6 accesses the air-conditioner information 7a and the fan information 7b stored in the storage device 7. Based on an increase in the temperature detected by the temperature sensors 5, the control device 6 selects which one of the output level of the air conditioner 3 and the rotation level of the fans 8 to be raised with reference to the accessed air-conditioner information 7a and fan information 7b. Then, based on the selection result, the control device 6 controls the output level of the air conditioner 3 and the rotation level of the fans 8.

In the above-described manner, according to the cooling system 1, the control device 6 selects which one of the output level of the air conditioner 3 and the rotation level of the fans 8 to be raised, based on an increase in the temperature detected by the temperature sensors 5. The selection is made with reference to the air-conditioner information 7a indicating the relationship between the cooling performance and the power consumption of the air conditioner 3 and the fan information 7b indicating the relationship between the cooling performance and the power consumption of the fans 8. Then, based on the selection result, the control device 6 controls the output level of the air conditioner 3 and the rotation level of the fans 8.

According to the cooling system 1, it is possible to raise one or both of the output level of the air conditioner 3 and the rotation level of the fans 8 in such a manner as to reduce an increase in the power consumption according to cooling performance desired based on the temperature detected by the temperature sensors 5. This reduces the entire power consumption of the predetermined space 2 used to cool the electronic devices 4a, 4b and so on.

Note that, for example, PUE (Power Usage Effectiveness) is known as an index value indicating the operational efficiency of the electronic devices 4a, 4b and so on. PUE is obtained, for example, by dividing the entire power consumption of the predetermined space 2 (including the power consumption of the electronic devices 4a, 4b and so on, the air conditioner 3, other equipment and the like all together) by the power consumption of the electronic devices 4a, 4b and so on. That is, even if the entire power consumption of the predetermined space 2 remains unchanged, PUE varies according to the ratio between the power consumption of the air conditioner 3 and the power consumption of the electronic devices 4a, 4b and so on.

According to the cooling system 1, cooling of the electronic device 4a, 4b and so on is achieved by controlling not only the output level of the air conditioner 3 but also the rotation level of the fans 8 provided in the electronic devices 4a, 4b and so on. For this reason, in the cooling system 1, the ratio between the power consumption of the air conditioner 3 and the power consumption of the electronic devices 4a, 4b and so on varies according to the output level of the air conditioner 3 and the rotation level of the fans 8, which results in a variation in PUE.

In view of the above, according to the cooling system 1, for example, the selection rule for selecting which one of the output level of the air conditioner 3 and the rotation level of the fans 8 to be raised is adjusted based on the index value indicating the operational efficiency of the electronic devices 4a, 4b and so on.

That is, according to the cooling system 1, the output level of the air conditioner 3 and the rotation level of the fans 8 are adjusted based on PUE. As a result, it is possible to reduce the entire power consumption of the predetermined space 2 used to cool the electronic devices 4a, 4b and so on, taking PUE into account.

(b) Second Embodiment

Next described is a second embodiment in which the cooling system 1 of the first embodiment is applied to a data center.

Figure 2:
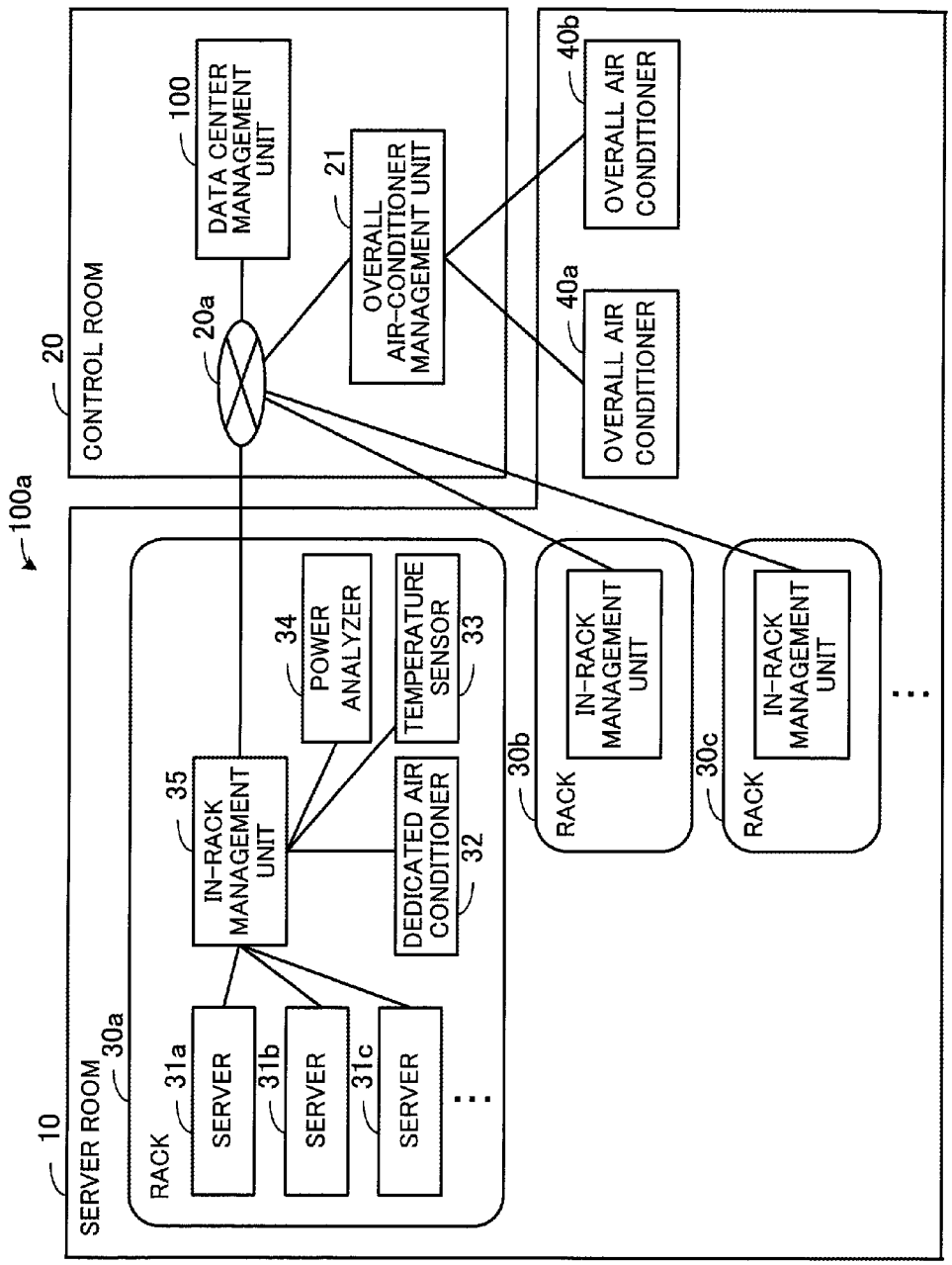
FIG. 2 illustrates an example of a cooling system according to a second embodiment.

FIG. 2 illustrates an example of a cooling system according to the second embodiment. A cooling system 100a includes a server room 10 and a control room 20. The server room 10 contains a plurality of racks 30a, 30b, 30c and so on and overall air conditioners 40a and 40b for cooling the inside of the server room 10. The control room 20 contains a data center management unit 100 and an overall air-conditioner management unit 21.

The rack 30a includes a plurality of servers 31a to 31c and so on, a dedicated air conditioner 32, a temperature sensor 33, a power analyzer 34, and an in-rack management unit 35. Each of the servers 31a to 31c and so on transmits and receives data to and from the in-rack management unit 35.

The dedicated air conditioner 32 cools the inside of the rack 30a. The output level of the dedicated air conditioner 32 is variable and controlled by a signal from the in-rack management unit 35. The temperature sensor 33 detects the temperature of the dedicated air conditioner 32 and then transmits the detected temperature to the in-rack management unit 35. The power analyzer 34 measures the power consumption of the dedicated air conditioner 32 and switches (not illustrated) and then transmits the measured power consumption to the in-rack management unit 35.

As in the case of the rack 30a, each of the remaining racks 30b, 30c and so on is provided with a plurality of servers, a dedicated air conditioner, a temperature sensor, a power analyzer, and an in-rack management unit.

The overall air-conditioner management unit 21 controls the overall air conditioners 40a and 40b installed in the server room 10, and also measures the power consumption of the overall air conditioners 40a and 40b. The data center management unit 100 transmits and receives data, via a network 20a, to and from the overall air-conditioner management unit 21 and the in-rack management units individually installed in each of the racks 30a to 30c and so on of the server room 10.

Figure 3:
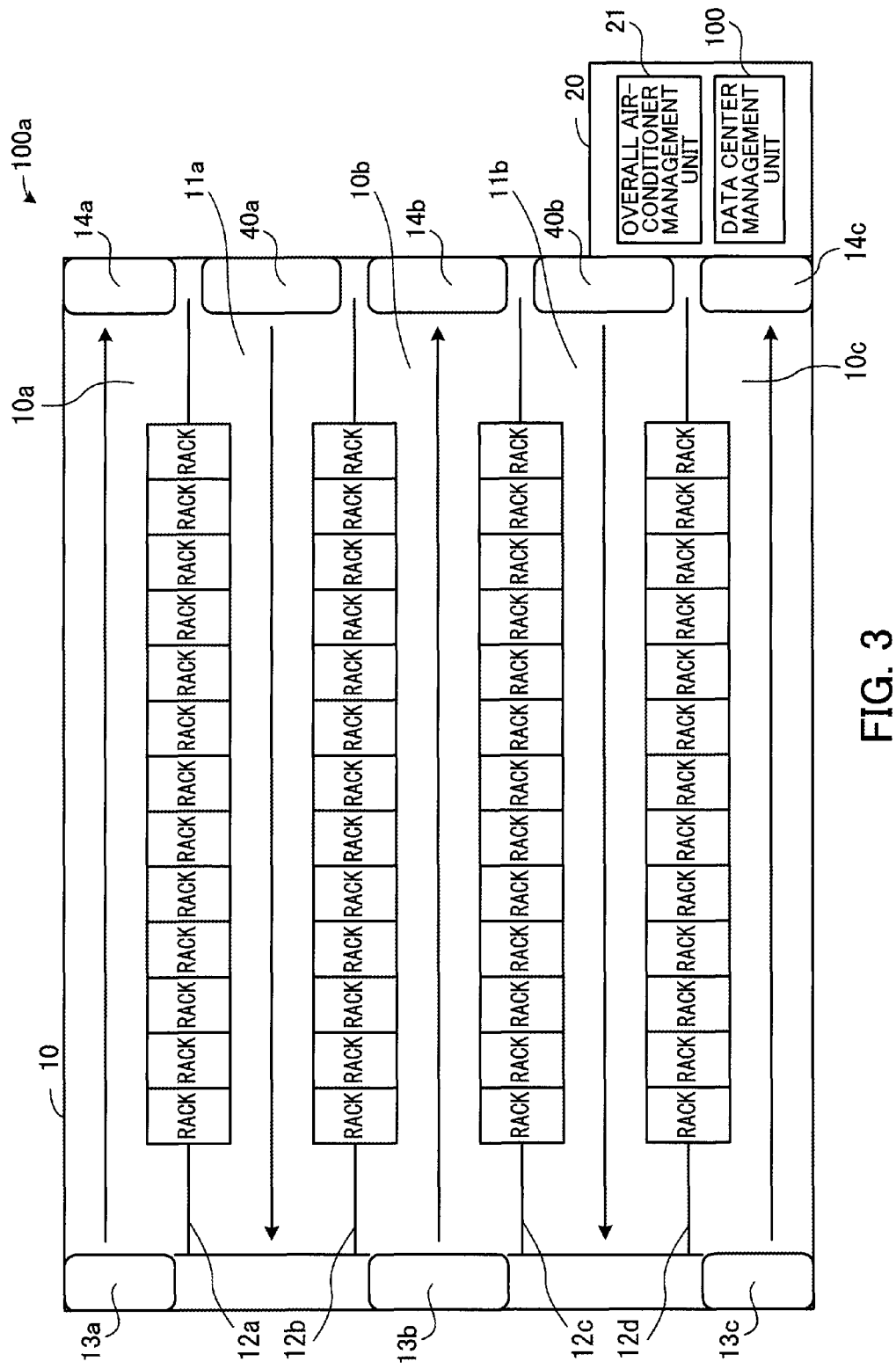
FIG. 3 illustrates a layout example of the cooling system according to the second embodiment.

Next described is a layout of the cooling system 100a. FIG. 3 illustrates a layout example of a cooling system according to the second embodiment. Hot aisles 10a, 10b, and 10c and cold aisles 11a and 11b are arranged in the server room 10. The cold aisle 11a is located between the hot aisles 10a and 10b. The cold aisle 11b is located between the hot aisles 10b and 10c.

Between the hot aisle 10a and the cold aisle 11a, a plurality of racks and a partition 12a are installed. Between the cold aisle 11a and the hot aisle 10b, a plurality of racks and a partition 12b are installed. Between the hot aisle 10b and the cold aisle 11b, a plurality of racks and a partition 12c are installed. Between the cold aisle 11b and the hot aisle 10c, a plurality of racks and a partition 12d are installed.

Fans 13a, 13b, and 13c are individually disposed at one end of the hot aisles 10a to 10c, and air intakes 14a, 14b, and 14c are individually provided at the other end. The overall air conditioners 40a and 40b are disposed at one end of the cold aisles 11a and 11b, respectively. Note that in FIG. 3, each arrow represents an airflow path.

In this condition, cold air supplied from the overall air conditioner 40a to the cold aisle 11a passes through servers installed in each of the plurality of racks disposed between the cold aisle 11a and the individual hot aisles 10a and 10b and, then, flows into the hot aisles 10a and 10b. In addition, cold air supplied from the overall air conditioner 40b to the cold aisle 11b passes through servers installed in each of the plurality of racks disposed between the cold aisle 11b and the individual hot aisles 10b and 10c and, then, flows into the hot aisles 10b and 10c.

The control room 20 is disposed, for example, next to the server room 10. The control room 20 is provided with the data center management unit 100 and the overall air-conditioner management unit 21. Note that the data center management unit 100 may be installed, for example, inside of each rack of the server room 10.

Figure 4:
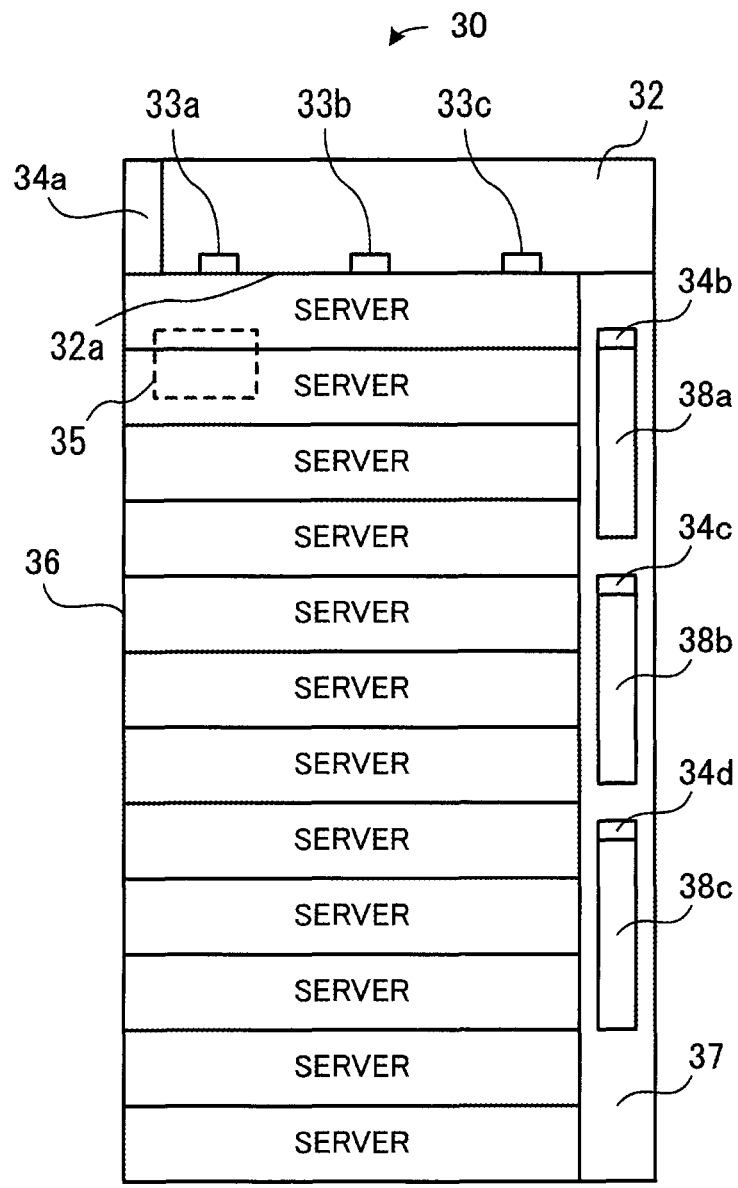
FIG. 4 is a front elevational view illustrating an example of a rack according to the second embodiment.

Next described are the racks disposed in the server room 10. FIG. 4 is a front elevational view illustrating an example of a rack according to the second embodiment. Note that FIG. 4 is a front elevational view of a rack as viewed from the hot aisle 10a, 10b or 10c or the cold aisle 11a or 11b.

A rack 30 represents the plurality of racks disposed in the server room 10. The rack 30 includes a chassis 36 for housing a plurality of servers. In addition, the dedicated air conditioner 32 for cooling the chassis 36 is located at the upper part of the rack 30. Temperature sensors 33a, 33b, and 33c are placed on an air outlet 32a of the dedicated air conditioner 32. In addition, the dedicated air conditioner 32 has a power analyzer 34a for measuring the power consumption of the dedicated air conditioner 32.

On a front panel 37 of the rack 30, switches 38a, 38b, and 38c are provided. In addition, the switches 38a to 38c have power analyzers 34b, 34c, and 34d, respectively, for measuring the power consumption of the corresponding switches 38a to 38c.

Further, the rack 30 houses the in-rack management unit 35 connected to the plurality of servers in the chassis 36, the dedicated air conditioner 32, the temperature sensors 33a to 33c, and the power analyzers 34a to 34d.

Figure 5:
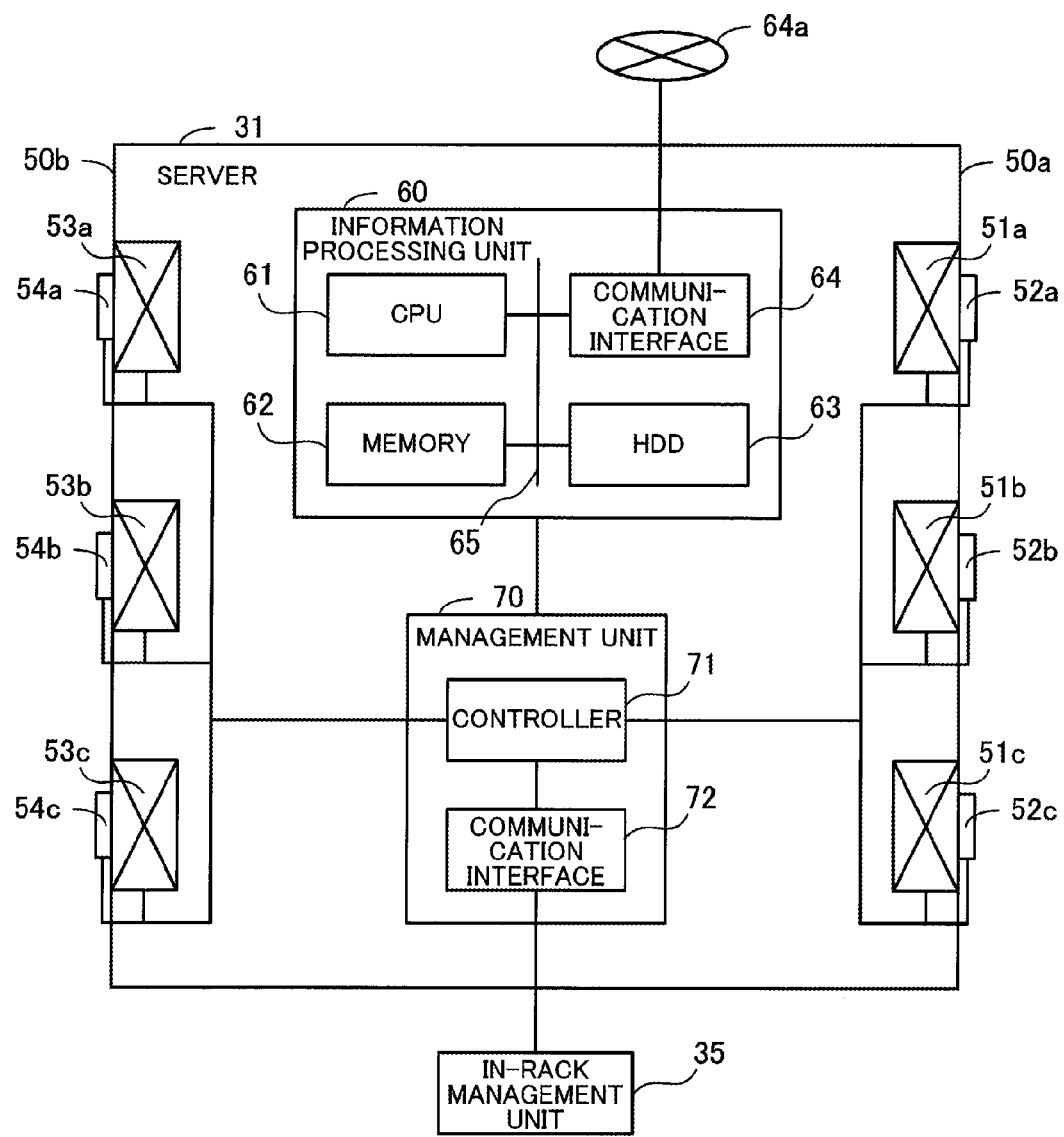
FIG. 5 illustrates a hardware example of a server according to the second embodiment.

Next described are the servers installed in the rack 30. FIG. 5 illustrates a hardware example of a server according to the second embodiment. A server 31 represents the plurality of servers installed in the rack 30. The server 31 has an end 50a facing the cold aisle 11a or 11b and an end 50b facing the hot aisle 10a, 10b, or 10c when being housed in the rack 30.

The end 50a has intake fans 51a, 51b and 51c whose rotation level is variable. The intake fans 51a to 51c bring air into the server 31 from the cold aisle 11a or 11b. The intake fans 51a to 51c are provided with intake-side temperature sensors 52a, 52b, and 52c, respectively.

The end 50b has exhaust fans 53a, 53b and 53c whose rotation level is variable. The exhaust fans 53a to 53c exhaust the air inside the server 31 to the hot aisle 10a, 10b, or 10c. The exhaust fans 53a to 53c are provided with exhaust-side temperature sensors 54a, 54b, and 54c, respectively.

Further, the server 31 has an information processing unit 60 and a management unit 70. Overall control of the information processing unit 60 is exercised by a CPU (central processing unit) 61. To the CPU 61, a memory 62, a HDD (hard disk drive) 63, and a communication interface 64 are connected via a bus 65.

The memory 62 is used as a main storage device of the information processing unit 60. The memory 62 temporarily stores at least part of an OS (operating system) program and application programs to be executed by the CPU 61. The memory 62 also stores therein various types of data to be used by the CPU 61 for its processing.

The HDD 63 magnetically writes and reads data to and from a built-in disk, and is used as a secondary storage device of the information processing unit 60. The HDD 63 stores therein the OS program, application programs, and various types of data. Note that a semiconductor storage device, such as a flash memory, may be used as the secondary storage device in place of the HDD 63.

The communication interface 64 is connected to a network 64a. To the network 64a, for example, a plurality of client terminals are connected. Via the network 64a, the communication interface 64 transmits and receives data to and from another computer or a communication device.

The management unit 70 includes a controller 71 and a communication interface 72. The controller 71 controls the rotation level of each of the intake fans 51a to 51c and the exhaust fans 53a to 53c. In addition, the controller 71 measures the rotational speed and power consumption of the individual intake fans 51a to 51c and exhaust fans 53a to 53c. Further, the controller 71 measures the power consumption of the CPU 61 of the information processing unit 60.

In addition, the controller 71 acquires temperature detected by the intake-side temperature sensors 52a to 52c and the exhaust-side temperature sensors 54a to 54c. For example, iRMC (integrated Remote Management Controller) or BMC (Base Management Controller) is used as the controller 71. The communication interface 72 is controlled by the controller 71 and transmits and receives data to and from the in-rack management unit 35.

Figure 6:
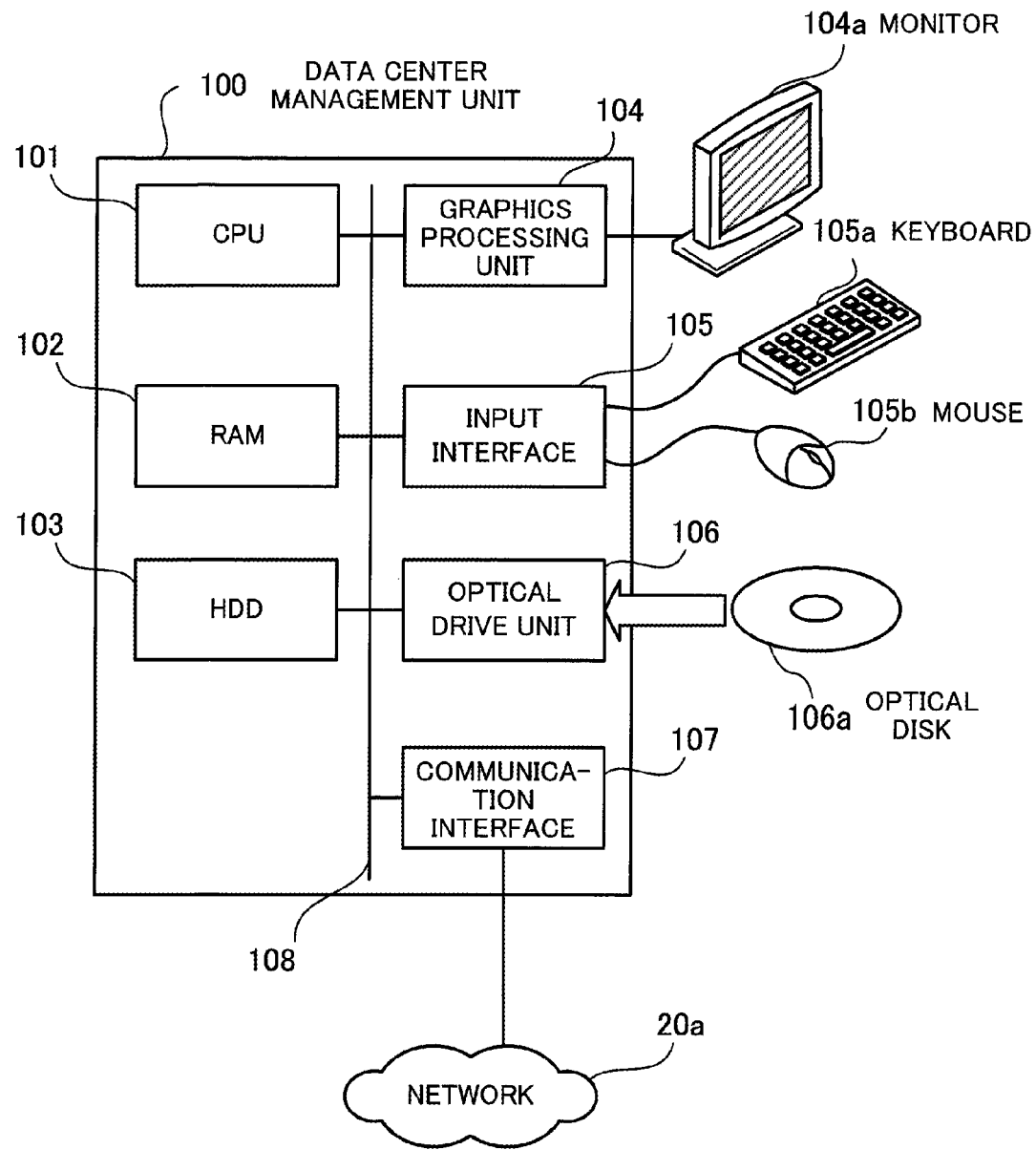
FIG. 6 illustrates a hardware example of a data center management unit according to the second embodiment.

Next described is hardware of the data center management unit 100 installed in the control room 20. FIG. 6 illustrates a hardware example of a data center management unit according to the second embodiment.

Overall control of the data center management unit 100 is exercised by a CPU 101. To the CPU 101, a RAM (random access memory) 102 and multiple peripherals are connected via a bus 108.

The RAM 102 is used as a main storage device of the data center management unit 100. The RAM 102 temporarily stores at least part of an OS program and application programs to be executed by the CPU 101. The RAM 102 also stores therein various types of data to be used by the CPU 101 for its processing.

The peripherals connected to the bus 108 include a HDD 103, a graphics processing unit 104, an input interface 105, an optical drive unit 106, and a communication interface 107.

The HDD 103 magnetically writes and reads data to and from a built-in disk, and is used as a secondary storage device of the data center management unit 100. The HDD 103 stores therein the OS program, application programs, and various types of data. Note that a semiconductor storage device, such as a flash memory, may be used as a secondary storage device in place of the HDD 103.

To the graphics processing unit 104, a monitor 104a is connected. According to an instruction from the CPU 101, the graphics processing unit 104 displays an image on a screen of the monitor 104a. A CRT (cathode ray tube) display or a liquid crystal display, for example, may be used as the monitor 104a.

To the input interface 105, a keyboard 105a and a mouse 105b are connected. The input interface 105 transmits signals sent from the keyboard 105a and the mouse 105b to the CPU 101. Note that the mouse 105b is just an example of pointing devices, and a different pointing device such as a touch panel, a tablet, a touch-pad, and a trackball, may be used instead.

The optical drive unit 106 reads data recorded on an optical disk 106a using, for example, laser light. The optical disk 106a is a portable recording medium on which data is recorded in such a manner as to be read by reflection of light. Examples of the optical disk 106a include a DVD (digital versatile disc), a DVD-RAM, a CD-ROM (compact disk read only memory), a CD-R (CD recordable), and a CD-RW (CD-rewritable).

The communication interface 107 is connected to the network 20a. Via the network 20a, the communication interface 107 transmits and receives data to and from different computers and communication devices.

The hardware configuration described above achieves the processing functions of this embodiment. Note that FIG. 6 illustrates the hardware configuration of the data center management unit 100, however, the overall air-conditioner management unit 21 is constructed with the same hardware configuration.

Figure 7:
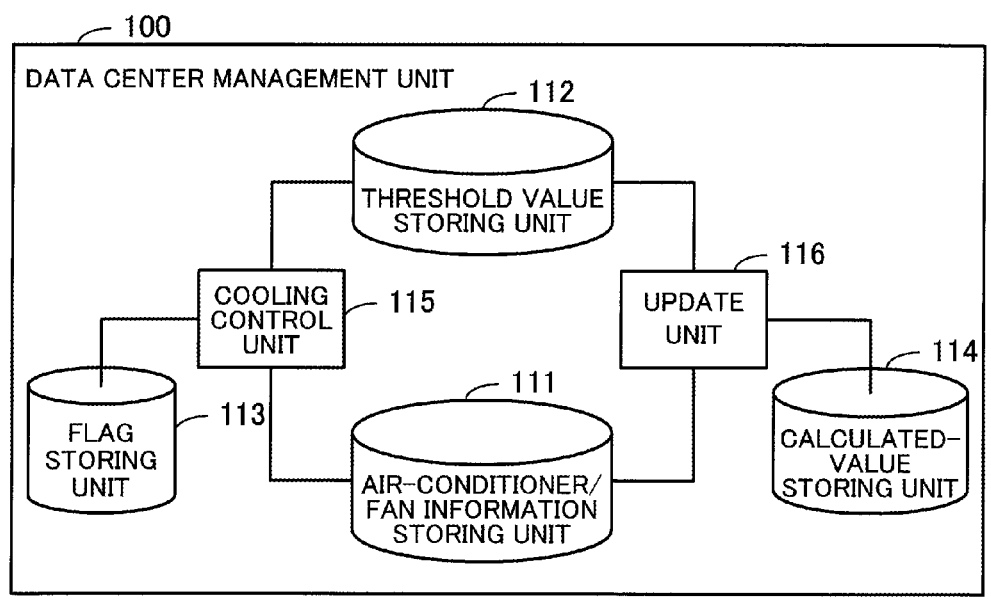
FIG. 7 illustrates a functional example of the data center management unit according to the second embodiment.

Next described are functions of the data center management unit 100. FIG. 7 illustrates a functional example of a data center management unit according to the second embodiment. The data center management unit 100 includes an air-conditioner/fan information storing unit 111, a threshold value storing unit 112, a flag storing unit 113, a calculated-value storing unit 114, a cooling control unit 115, and an update unit 116.

The air-conditioner/fan information storing unit 111 stores therein air-conditioner/fan information prepared for each rack installed in the server room 10. The air-conditioner/fan information for each rack indicates a relationship between temperature of the servers and power consumption of the dedicated air conditioner 32 and a relationship between the temperature of the servers and power consumption of the intake fans 51a to 51c and the exhaust fans 53a to 53c of the servers.

The threshold value storing unit 112 stores therein temperature threshold values Ts1 and Ts2 (Ts1<Ts2) provided with respect to each rack installed in the server room 10. Ts1 and Ts2 are threshold values to be compared with the temperature of the servers to thereby determine whether to cool the servers by the dedicated air conditioner 32 or by the intake fans 51a to 51c and the exhaust fans 53a to 53c, or not to cool the servers.

The flag storing unit 113 stores therein rotational speed up flags corresponding one-to-one with individual servers of each rack installed in the server room 10. Each rotational speed up flag indicates whether the rotational speed of the intake fans 51a to 51c and the exhaust fans 53a to 53c of a corresponding server has been increased. The calculated-vale storing unit 114 stores therein data calculated by the update unit 116.

The cooling control unit 115 accesses individual servers of each rack installed in the server room 10 to thereby acquire temperature detected by the intake-side temperature sensors 52a to 52c and the exhaust-side temperature sensors 54a to 54c. Then, the cooling control unit 115 calculates $\Delta SVT$ by subtracting the average value of the temperature detected by the intake-side temperature sensors 52a to 52c from the average value of the temperature detected by the exhaust-side temperature sensors 54a to 54c. Here, $\Delta SVT$ is used as an index indicating the temperature inside a corresponding server.

Further, the cooling control unit 115 compares the calculated $\Delta SVT$ with $\Delta SVT0$ which is $\Delta SVT$ obtained when the corresponding server is in the idle state. $\Delta SVT0$ is, for example, 5.0° C. In addition, the cooling control unit 115 calculates $\Delta T$ by subtracting $\Delta SVT0$ from the calculated $\Delta SVT$. That is, $\Delta T$ represents an increase in the temperature of the server from the idle state.

Subsequently, the cooling control unit 115 compares the calculated $\Delta T$ with corresponding Ts1 and Ts2 stored in the threshold value storing unit 112.

Further, the cooling control unit 115 accesses the dedicated air conditioner 32 of each rack installed in the server room 10 to thereby control the output level of the dedicated air conditioner 32. In addition, the cooling control unit 115 accesses individual servers of each rack installed in the server room 10 to thereby increase or decrease the rotational speed of the intake fans 51a to 51c and the exhaust fans 53a to 53c. Then, the cooling control unit 115 enables or disables the rotational speed up flag of each server, stored in the flag storing unit 113.

Note here that the rotation of the intake fans 51a to 51c and the exhaust fans 53a to 53c is controlled by built-in firmware of a corresponding server, independent of the cooling control unit 115. For example, the rotational speed of the intake fans 51a to 51c and the exhaust fans 53a to 53c increases at a constant rate when the ambient temperature exceeds 25° C., and also increases at a constant rate when the temperature of the CPU 61 exceeds 70° C. Note however that the control by the cooling control unit 115 has a priority over the control by the firmware.

The update unit 116 changes the value of Ts2 stored in the threshold value storing unit 112 based on the air-conditioner/fan information stored in the air-conditioner/fan information storing unit 111. Further, the update unit 116 accesses individual servers of each rack installed in the server room 10 to thereby acquire the power consumption of the intake fans 51a to 51c, the exhaust fans 53a to 53c, and the CPU 61. Then, the update unit 116 adds up all the acquired power consumption to calculate server power consumption (Sall).

Further, the update unit 116 accesses the individual racks installed in the serer room 10 to thereby acquire the power consumption of the dedicated air conditioners 32, and also accesses the overall air-conditioner management unit 21 to thereby acquire the power consumption of the overall air conditioners 40a and 40b. Then, the update unit 116 adds up all the acquired power consumption to calculate air-conditioner power consumption (Tall).

Further, the update unit 116 adds together the calculated Sall and Tall to calculate overall power consumption (Pall). Then, the update unit 116 calculates PUE by dividing the calculated Pall by Sall. PUE may be used as an index indicating energy efficiency of the server room 10.

Note here that PUE is generally obtained by dividing the power consumption of the entire data center (i.e. the power consumption of information technology devices, air-conditioning units, electric power systems, lighting equipment, monitoring devices and the like) by the power consumption of the information technology devices. However, in this embodiment, PUE is obtained by dividing Pall by Sall, as described above, with the focus upon only elements varying according to the operating condition and operation mode of the data center.

In addition, the update unit 116 stores the calculated Sall, Tall, Pall, and PUE in the calculated-value storing unit 114. The update unit 116 also comparatively verifies the calculated Sall, Tall, Pall, and PUE with those stored in the calculated-value storing unit 114. Then, based on the verification result, the update unit 116 fine-tunes the value of Ts2 stored in the threshold value storing unit 112.

In addition, the update unit 116 accesses individual servers of each rack installed in the server room 10 to thereby acquire the power consumption of the intake fans 51a to 51c and the exhaust fans 53a to 53c.

Then, the update unit 116 calculates $\Delta W$ by subtracting, from the acquired power consumption, the power consumption of the intake fans 51a to 51c and the exhaust fans 53a to 53c obtained when a corresponding server is in the idle state. That is, $\Delta W$ represents an increase in the power consumption of the server from the idle state.

Subsequently, the update unit 116 updates the air-conditioner/fan information stored in the air-conditioner/fan information storing unit 111 based on the $\Delta T$ calculated by the cooling control unit 115 and the calculated $\Delta W$.

Next described is the air-conditioner/fan information stored in the air-conditioner/fan information storing unit 111. FIG. 8 illustrates an example of air-conditioner/fan information according to the second embodiment. The air-conditioner/fan information 111a is an example of air-conditioner/fan information prepared for one rack installed in the server room 10.

The air-conditioner/fan information 111a indicates the relationship of $\Delta T$ (° C.), which is an increase in the temperature of each server of the rack from the idle state, with $\Delta W(W)$ obtained by subtracting the power consumption of the dedicated air conditioner 32 used when the server is in the idle state from the power consumption of the dedicated air conditioner 32 used to cool the server.

Further, the air-conditioner/fan information 111a also indicates the relationship of $\Delta T$ with $\Delta W(W)$ obtained by subtracting the power consumption of the intake fans 51a to 51c and the exhaust fans 53a to 53c used when the server is in the idle state from the power consumption of the intake fans 51a to 51c and the exhaust fans 53a to 53c used to cool the server. Note that the term "fans" in FIG. 8 refers to the intake fans 51a to 51c and the exhaust fans 53a to 53c.

The air-conditioner/fan information 111a indicates, for example, that when $\Delta T$ is 4.0° C., the power consumption is 80 W to cool the server by the dedicated air conditioner 32 and 51.2 W to cool the server by the intake fans 51a to 51c and the exhaust fans 53a to 53c. Note that $\Delta W$ associated with the dedicated air conditioner 32 in the air-conditioner/fan information 111a is updated on a day-to-day basis.

Figure 9A:
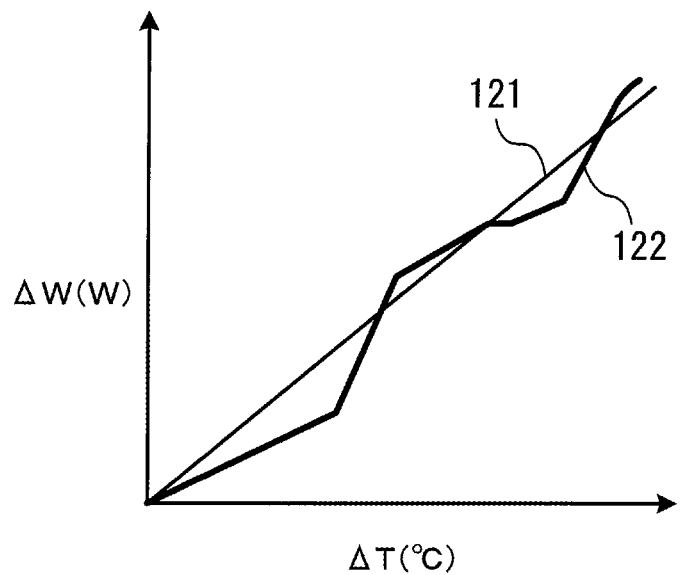
FIGS. 9A and 9B illustrate relationship examples between $\Delta T$ and $\Delta W$ according to the second embodiment.
Figure 9B:
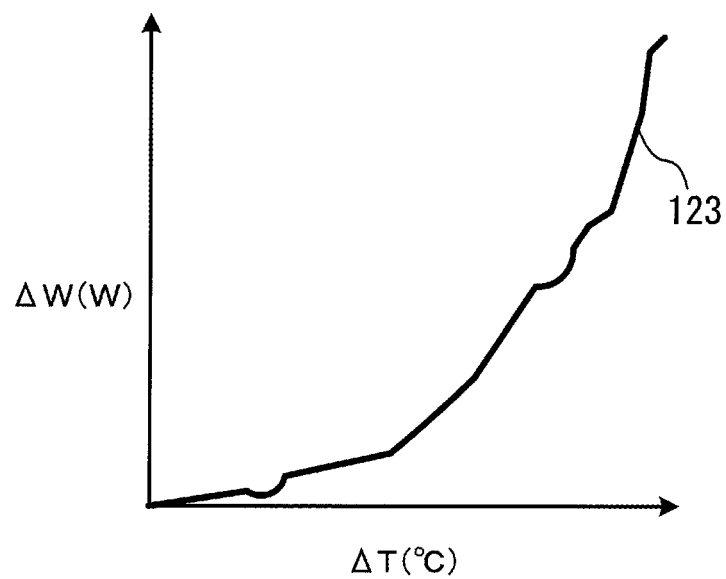

FIGS. 9A and 9B illustrate relationship examples between $\Delta T$ and $\Delta W$ according to the second embodiment. The graph of FIG. 9A represents a relationship between $\Delta T$ and $\Delta W$ associated with the dedicated air conditioner 32. The horizontal axis and vertical axis of the graph represent $\Delta T$ and $\Delta W$, respectively. A characteristic 121 represents calculated values, and a characteristic 122 represents actually measured values. Note that the characteristics 121 and 122 of the graph are obtained when the ambient temperature ranges between 25 and 30° C.

As indicated by the characteristic 121, the calculated relationship between $\Delta T$ and $\Delta W$ is roughly proportional. The slope of the characteristic 121 changes according to, for example, the ambient temperature and thermal insulation performance of the server room 10. In addition, as indicated by the characteristic 122, the actually measured relationship between $\Delta T$ and $\Delta W$ is represented by not a straight line but a polygonal line.

The graph of FIG. 9B represents a relationship between $\Delta T$ and $\Delta W$ associated with the intake fans 51a to 51c and the exhaust fans 53a to 53c. The horizontal axis and vertical axis of the graph represent $\Delta T$ and $\Delta W$, respectively. A characteristic 123 represents actually measured values. Note that the characteristic 123 of the graph is obtained when the ambient temperature ranges between 25 and 30° C.

As indicated by the characteristic 123, the rate of increase in $\Delta W$ becomes greater when $\Delta T$ is larger.

This is due to a sharp rise in the power consumption of the intake fans 51a to 51c and the exhaust fans 53a to 53c as the rotational speed of the intake fans 51a to 51c and the exhaust fans 53a to 53c increases. For example, the power consumption of the intake fans 51a to 51c and the exhaust fans 53a to 53c increases in proportion to the third power of the rotational speed of the intake fans 51a to 51c and the exhaust fans 53a to 53c.

As illustrated in FIGS. 9A and 9B, the relationship between $\Delta T$ and $\Delta W$ associated with the dedicated air conditioner 32 is roughly proportional; and on the other hand, as for the relationship between $\Delta T$ and $\Delta W$ associated with the intake fans 51a to 51c and the exhaust fans 53a to 53c, the rate of increase in $\Delta W$ is greater when $\Delta T$ is larger. Note that when $\Delta T$ is small, $\Delta W$ associated with the intake fans 51a to 51c and the exhaust fans 53a to 53c may become smaller than $\Delta W$ associated with the dedicated air conditioner 32.

Therefore, when $\Delta T$ is small, $\Delta W$ associated with the intake fans 51a to 51c and the exhaust fans 53a to 53c may be smaller than $\Delta W$ associated with the dedicated air conditioner 32, and when $\Delta T$ is large, $\Delta W$ associated with the dedicated air conditioner 32 may be smaller than $\Delta W$ associated with the intake fans 51a to 51c and the exhaust fans 53a to 53c. That is, the magnitude relationship between $\Delta W$ associated with the dedicated air conditioner 32 and $\Delta W$ associated with the intake fans 51a to 51c and the exhaust fans 53a to 53c becomes inverted at a given value of $\Delta T$.

Note that Ts2 stored in the threshold value storing unit 112 is set to a value of the point at which the magnitude relationship between $\Delta W$ associated with the dedicated air conditioner 32 and $\Delta W$ associated with the intake fans 51a to 51c and the exhaust fans 53a to 53c becomes inverted.

In the case of the air-conditioner/fan information 111a of FIG. 8, the magnitude relationship between $\Delta W$ associated with the dedicated air conditioner 32 and $\Delta W$ associated with the intake fans 51a to 51c and the exhaust fans 53a to 53c becomes inverted at the point where $\Delta T$ is 5.0° C. That is, in the case of the air-conditioner/fan information 111a, Ts2 is set to 5.0° C. In this case, Ts1 is set to 3.0° C., for example.

Note that because the relationships between $\Delta T$ and $\Delta W$ associated with the dedicated air conditioner 32 and between $\Delta T$ and $\Delta W$ associated with the intake fans 51a to 51c and the exhaust fans 53a to 53c change according to the surrounding environment and the like, the point at which the inversion in the magnitude relationship of $\Delta W$ occurs always changes.

Figure 10:
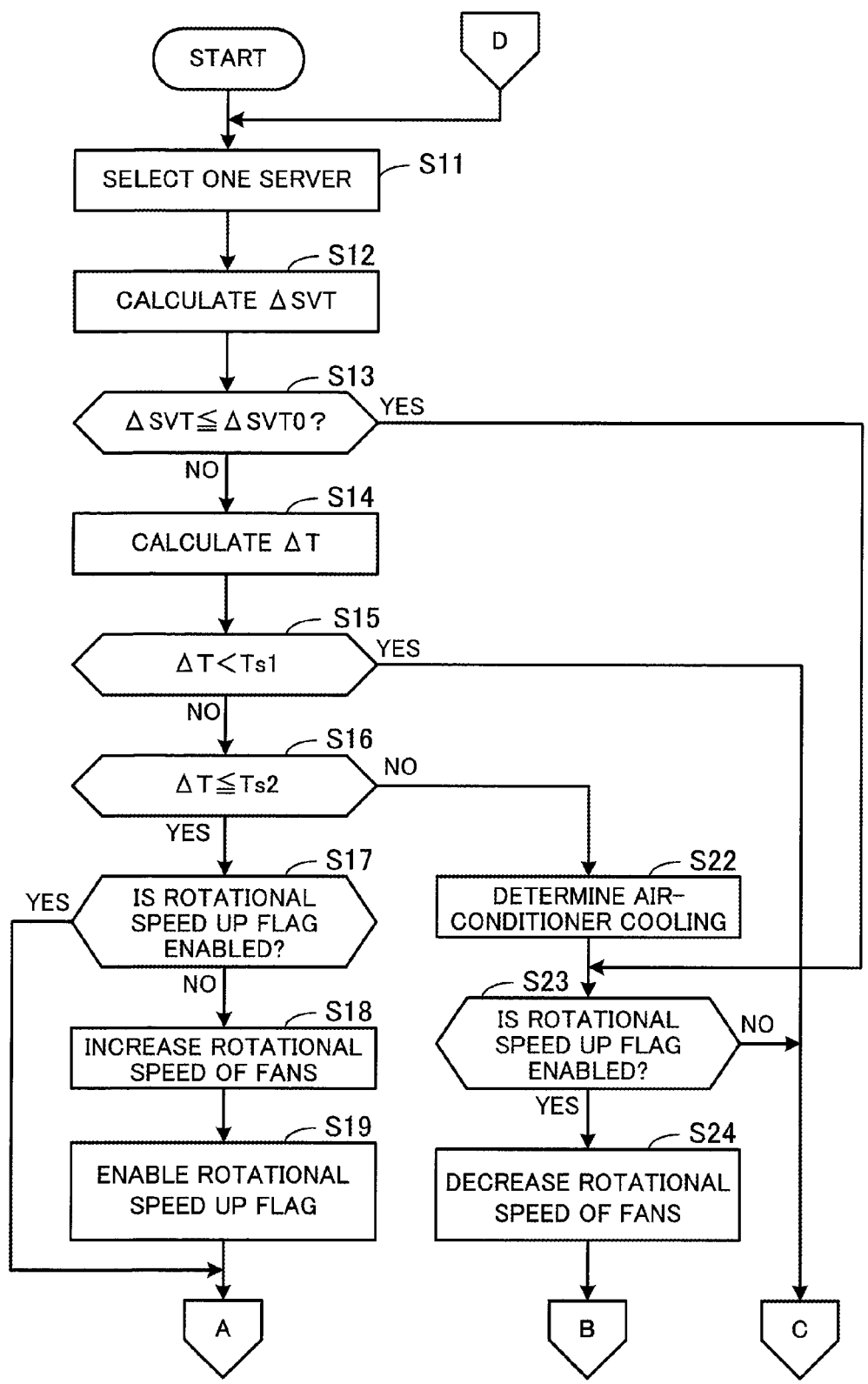
FIG. 10 is a flowchart illustrating a procedure example for cooling servers according to the second embodiment.
Figure 11:
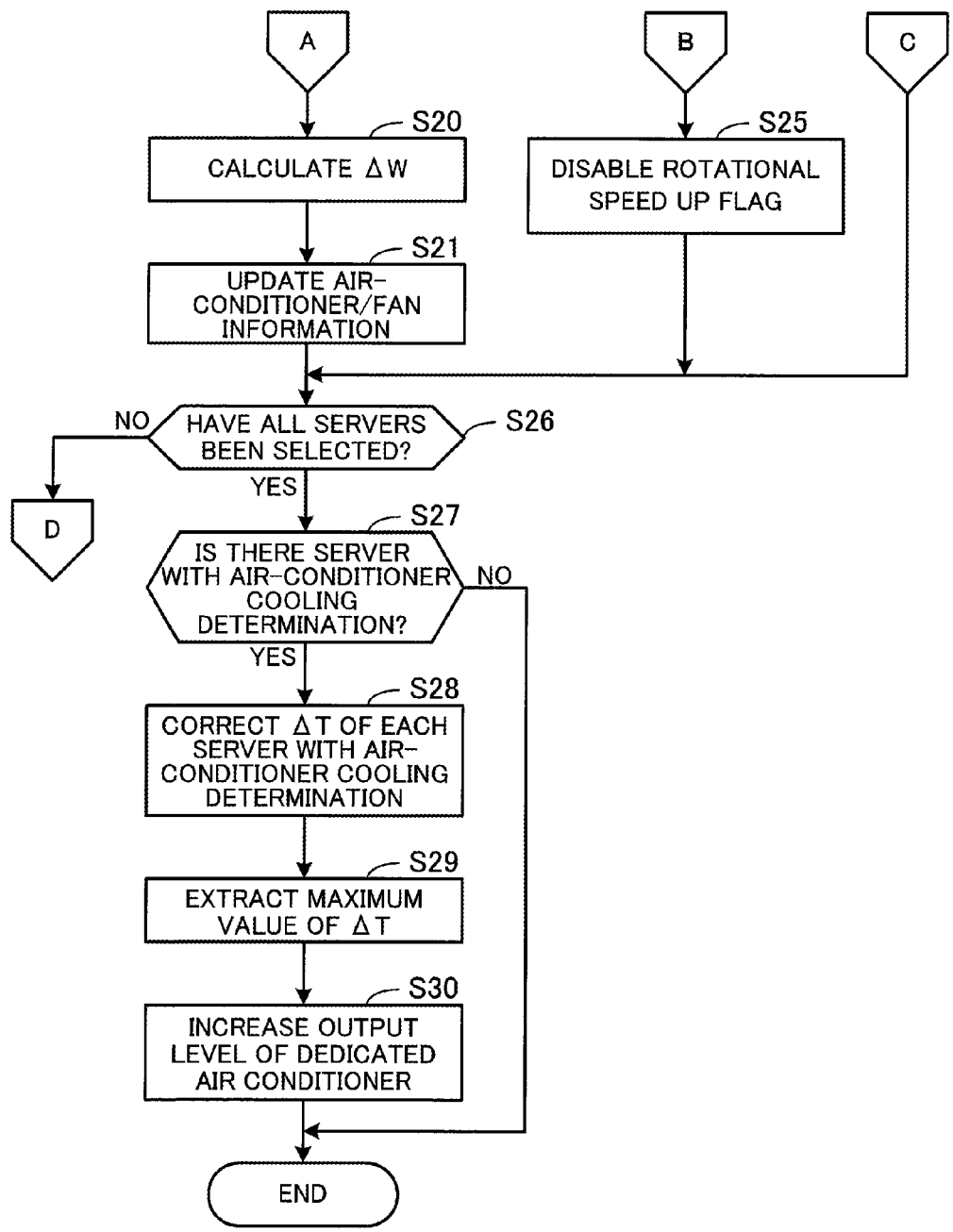
FIG. 11 is a flowchart illustrating the procedure example for cooling servers according to the second embodiment.

Next described is a procedure for cooling servers implemented by the data center management unit 100. FIGS. 10 and 11 are a flowchart illustrating a procedure example for cooling servers according to the second embodiment. The processing illustrated in FIGS. 10 and 11 is performed for each rack installed in the server room 10. In addition, the processing is periodically carried out, for example, at one-minute intervals. Assume here that the air-conditioner/fan information storing unit 111 stores therein air-conditioner/fan information, the threshold value storing unit 112 stores therein Ts1 and Ts2, and the calculated-value storing unit 114 stores therein Sall, Tall, Pall, and PUE calculated by the update unit 116 in the previous processing.

[Step S11] The cooling control unit 115 selects one server of a target rack.

[Step S12] The cooling control unit 115 accesses the selected server to acquire temperature detected by the intake-side temperature sensors 52a to 52c and the exhaust-side temperature sensors 54a to 54c. Then, the cooling control unit 115 calculates $\Delta SVT$ by subtracting the average value of the temperature detected by the intake-side temperature sensors 52a to 52c from the average value of the temperature detected by the exhaust-side temperature sensors 54a to 54c.

[Step S13] The cooling control unit 115 determines whether the calculated $\Delta SVT$ is equal to or less than $\Delta SVT0$. If $\Delta SVT$ is equal to or less than $\Delta SVT0$, the cooling control unit 115 proceeds to step S23. On the other hand, if $\Delta SVT$ exceeds $\Delta SVT0$, the cooling control unit 115 proceeds to step S14.

[Step S14] The cooling control unit 115 calculates $\Delta T$ by subtracting $\Delta SVT0$ from the calculated $\Delta SVT$.

[Step S15] The cooling control unit 115 determines whether the calculated $\Delta T$ is smaller than Ts1 set for the rack, stored in the threshold value storing unit 112. If $\Delta T$ is smaller than Ts1, the cooling control unit 115 proceeds to step S26. On the other hand, if $\Delta T$ is equal to or more than Ts1, the cooling control unit 115 proceeds to step S16.

[Step S16] The cooling control unit 115 determines whether the calculated $\Delta T$ is equal to or less than Ts2 set for the rack, stored in the threshold value storing unit 112. If $\Delta T$ is equal to or less than Ts2, the cooling control unit 115 proceeds to step S17. On the other hand, if $\Delta T$ is more than Ts2, the cooling control unit 115 proceeds to step S22.

[Step S17] The cooling control unit 115 determines whether the rotational speed up flag of the selected server, stored in the flag storing unit 113, is enabled. If the rotational speed up flag is enabled, the cooling control unit 115 proceeds to step S20. On the other hand, if the rotational speed up flag is disabled, the cooling control unit 115 proceeds to step S18.

[Step S18] The cooling control unit 115 accesses the selected server to increase the rotational speed of the intake fans 51a to 51c and the exhaust fans 53a to 53c.

[Step S19] The cooling control unit 115 enables the rotational speed up flag of the server, stored in the flag storing unit 113.

[Step S20] The update unit 116 accesses the selected server to acquire the power consumption of the intake fans 51a to 51c and the exhaust fans 53a to 53c. Then, the update unit 116 calculates $\Delta W$ by subtracting, from the acquired power consumption, the power consumption of the intake fans 51a to 51c and the exhaust fans 53a to 53c obtained when the server is in the idle state.

[Step S21] Based on $\Delta T$ calculated by the cooling control unit 115 and the calculated $\Delta W$, the update unit 116 updates the air-conditioner/fan information of the rack, stored in the air-conditioner/fan information storing unit 111, and then proceeds to step S26.

[Step S22] The cooling control unit 115 determines to cool the selected server by the dedicated air conditioner 32 ("air-conditioner cooling determination").

[Step S23] The cooling control unit 115 determines whether the rotational speed up flag of the selected server, stored in the flag storing unit 113, is enabled. If the rotational speed up flag is enabled, the cooling control unit 115 proceeds to step S24. On the other hand, if the rotational speed up flag is disabled, the cooling control unit 115 proceeds to step S26.

[Step S24] The cooling control unit 115 accesses the selected server to decrease the rotational speed of the intake fans 51a to 51c and the exhaust fans 53a to 53c.

[Step S25] The cooling control unit 115 disables the rotational speed up flag of the server, stored in the flag storing unit 113, and then proceeds to step S26.

[Step S26] The cooling control unit 115 determines whether all servers of the rack have been selected. If all the servers have been selected, the cooling control unit 115 proceeds to step S27. If there is an unselected server, the cooling control unit 115 returns to step S11.

[Step S27] The cooling control unit 115 determines whether, in the rack, there is one or more servers having received an air-conditioner cooling determination. If there is one or more servers having received an air-conditioner cooling determination, the cooling control unit 115 proceeds to step S28. On the other hand, if there is no server with an air-conditioner cooling determination, the cooling control unit 115 ends the processing.

[Step S28] The cooling control unit 115 collects ΔT of each server with an air-conditioner cooling determination.

[Step S29] The cooling control unit 115 extracts a maximum value from the collected ΔTs.

[Step S30] The cooling control unit 115 accesses the dedicated air conditioner 32 to increase the output level of the dedicated air conditioner 32 based on the extracted maximum value, and then ends the processing.

Figure 12:
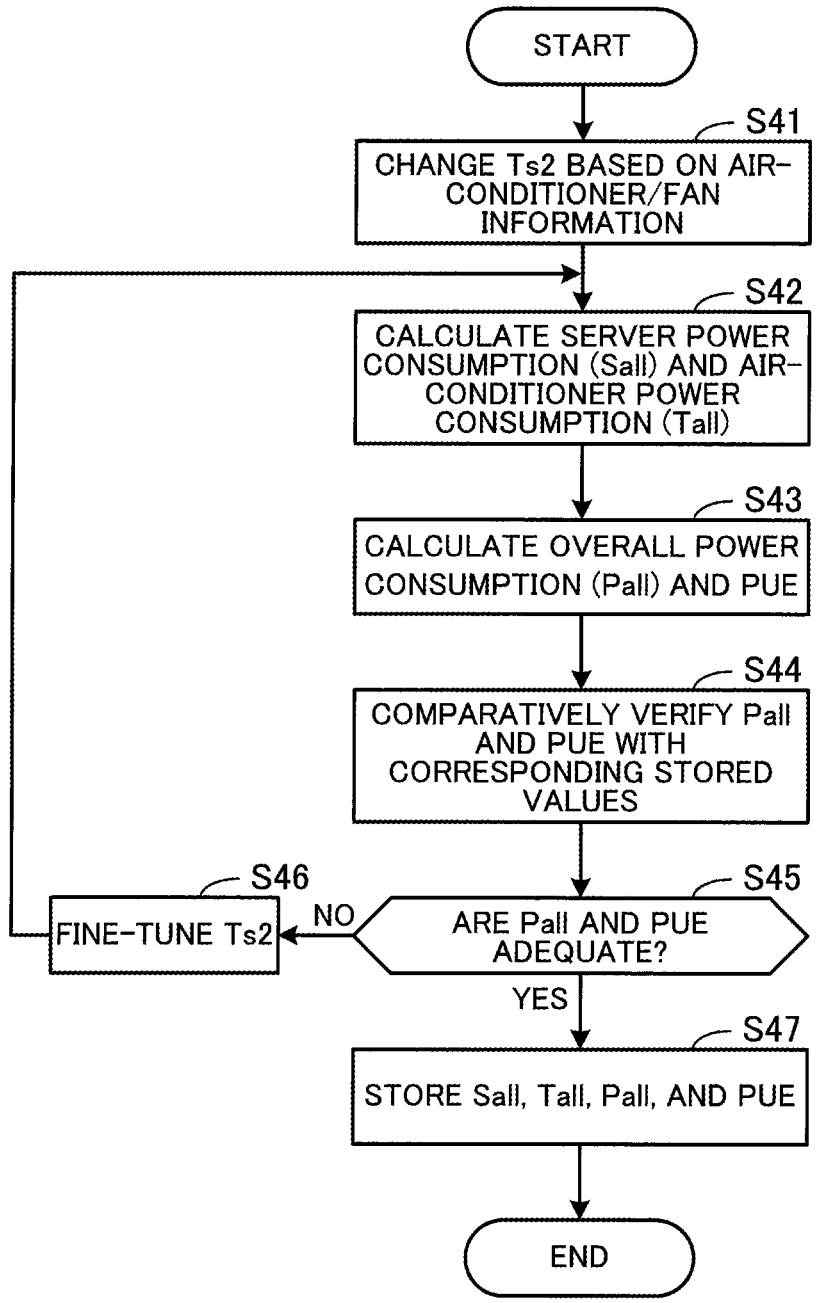
FIG. 12 is a flowchart illustrating a procedure example for setting Ts2 according to the second embodiment.

Next described is a procedure for setting Ts2 implemented by the data center management unit 100. FIG. 12 is a flowchart illustrating a procedure example for setting Ts2 according to the second embodiment. The processing illustrated in FIG. 12 is performed for each rack installed in the server room 10. In addition, the process is periodically carried out, for example, at one-hour intervals. Assume here that the air-conditioner/fan information storing unit 111 stores therein air-conditioner/fan information, the threshold value storing unit 112 stores therein Ts1 and Ts2, and the calculated-value storing unit 114 stores therein Sall, Tall, Pall, and PUE calculated by the update unit 116 in the previous processing.

[Step S41] Based on the air-conditioner/fan information of a target rack, stored in the air-conditioner/fan information storing unit 111, the update unit 116 changes the value of Ts2 of the target rack stored in the threshold value storing unit 112.

Specifically, the update unit 116 changes the value of Ts2 to ΔT in the air-conditioner/fan information, at which the magnitude relationship between ΔW associated with the dedicated air conditioner 32 and ΔW associated with the intake fans 51a to 51c and the exhaust fans 53a to 53c becomes inverted. For example, in the case where the air-conditioner/fan information is the air-condition fan information 111a of FIG. 8, the update unit 116 changes the value of Ts2 to 5.0° C.

[Step S42] The update unit 116 accesses individual servers of each rack installed in the server room 10 to thereby acquire the power consumption of the intake fans 51a to 51c, the exhaust fans 53a to 53c, and the CPU 61. Then, the update unit 116 adds up all the acquired power consumption to calculate the server power consumption (Sall).

Further, the update unit 116 accesses each rack installed in the serer room 10 to thereby acquire the power consumption of the dedicated air conditioners 32, and also accesses the overall air-conditioner management unit 21 to thereby acquire the power consumption of the overall air conditioners 40a and 40b. Then, the update unit 116 adds up all the acquired power consumption to calculate the air-conditioner power consumption (Tall).

[Step S43] The update unit 116 adds together the calculated Sall and Tall to calculate the overall power consumption (Pall). Then, the update unit 116 calculates PUE by dividing the calculated Pall by Sall.

[Step S44] The update unit 116 comparatively verifies the calculated Pall and PUE with those stored in the calculated-value storing unit 114.

[Step S45] The update unit 116 determines whether the calculated Pall and PUE are adequate. If the calculate Pall and PUE are adequate, the update unit 116 proceeds to step S47. On the other hand, if the calculated Pall and PUE are not adequate, the update unit 116 proceeds to step S46.

[Step S46] The update unit 116 fine-tunes the value of Ts2 of the target rack, stored in the threshold value storing unit 112, in such a manner that Pall and PUE approach adequate values.

[Step S47] The update unit 116 stores the calculated Sall, Tall, Pall, and PUE in the calculated-value storing unit 114 and then ends the processing.

As described above, according to the cooling system 100a, the cooling control unit 115 calculates ΔT from temperature detected by the intake-side temperature sensors 52a to 52c and the exhaust-side temperature sensors 54a to 54c of each server. In addition, based on the air-conditioner/fan information indicating the calculated ΔT, the relationship between ΔT and the power consumption of the dedicated air conditioner 32, and the relationship between ΔT and the power consumption of the intake fans 51a to 51c and the exhaust fans 53a to 53c, the cooling control unit 115 controls the output level of the dedicated air conditioner 32 and the rotation level of the intake fans 51a to 51c and the exhaust fans 53a to 53c. In this manner, it is possible to always actively raise the output (rotation) level of either the dedicated air conditioner 32 or the fans, whichever has lower power consumption, according to the level of an increase in temperature of the servers. This results in less power to cool the servers.

In addition, according to the cooling system 100a, the update unit 116 updates the air-conditioner/fan information stored in the air-conditioner/fan information storing unit 111 based on ΔT calculated by the cooling control unit 115 and the calculated ΔW. With this, the relationship between ΔT and ΔW of the intake fans 51a to 51c and the exhaust fans 53a to 53c, which relationship is susceptible to the surrounding environment and the like, is reflected to the air-conditioner/fan information on an as-needed basis.

Further, according to the cooling system 100a, the update unit 116 fine-tunes the value of Ts2 stored in the threshold value storing unit 112, based on the calculated PUE. This enables the output level of the dedicated air conditioner 32 and the rotation level of the intake fans 51a to 51c and the exhaust fans 53a to 53c to be controlled so as to lower PUE.

Next described is the relationship between PUE and Pall. FIG. 13 illustrates a relationship among Sall, Tall, PUE, and Pall. As described above, PUE is obtained by dividing Pall by Sall, and Pall is obtained by adding together Sall and Tall.

Eleven patterns of changes (increases and decreases) in PUE and Pall are observed when the values of Sall and Tall individually increase (↑), decrease (↓), or have no change (–), as illustrated in FIG. 13. According to FIG. 13, Patterns 2, 7, and 11 have an increase in PUE although having a decrease in Pall. That is, PUE may increase even in the case where a decrease in Pall, namely, a decrease in the power consumption is achieved.

Even in such a case, according to the cooling system 100a, the update unit 116 fine-tunes the value of Ts2 stored in the threshold value storing unit 112, based on the calculated PUE. Herewith, the cooling system 100a is capable of controlling the output level of the dedicated air conditioner 32 and the rotation level of the intake fans 51a to 51c and the exhaust fans 53a to 53c to decrease PUE.

Note that the processing functions described above may be achieved by a computer. In this case, a program is provided which describes processing contents of the functions to be implemented by the data center management unit 100. By executing the program on the computer, the above-described processing functions are achieved on the computer. The program in which the processing contents are described may be recorded on computer-readable recording media. Such computer-readable recording media include a magnetic storage device, an optical disk, a magneto-optical recording medium, and a semiconductor memory. Examples of the magnetic storage device are a HDD, a flexible disk (FD), and a magnetic tape. Examples of the optical disk are a DVD, a DVD-RAM, a CD-ROM, and a CD-RW. An example of the magneto-optical recording medium is a magneto-optical disk (MO).

To distribute the program, for example, portable recording media, such as DVDs and CD-ROMs, on which the program is recorded are sold. In addition, the program may be stored in a storage device of a server computer and then transferred from the server computer to another computer via a network.

A computer for executing the program stores, for example, in its own storage device, the program which is originally recorded on a portable recording medium or transferred from the server computer. Subsequently, the computer reads the program from its own storage device and performs processing according to the program. Note that the computer is able to read the program directly from the portable recording medium and perform processing according to the program. In addition, the computer is able to sequentially perform processing according to a received program each time such a program is transferred from a server computer connected via a network.

In addition, at least part of the above-described processing functions may be achieved by an electronic circuit, such as a DSP (digital signal processor), an ASIC (application specific integrated circuit), and a PLD (programmable logic device).

According to one aspect, it is possible to effectively cool electronic devices.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A cooling system comprising:
    an air conditioner configured to be capable of cooling a predetermined space and changing an air volume or a set temperature thereof;
    at least one electronic device disposed in the predetermined space and provided with a fan whose rotational speed is variable;
    a temperature sensor configured to detect a temperature of the at least one electronic device; and
    a control apparatus configured control the air conditioner so as to increase the air volume or decrease the set temperature, or to control the fan so as to increase the rotational speed, based on a rise in the temperature of the at least one electronic device detected by the temperature sensor, air-conditioner information and fan information, wherein the air-conditioner information indicates a relationship between cooling performance and power consumption of the air conditioner, and the fan information indicates a relationship between cooling performance and power consumption of the fan, wherein
    the control apparatus controls the fan so as to increase the rotational speed when the rise in the temperature of the at least one electronic device detected by the temperature sensor is smaller than a threshold value, and controls the air conditioner so as to increase the air volume or decrease the set temperature when the rise in the temperature of the at least one electronic device detected by the temperature sensor is greater than or equal to the threshold value, and
    sets the threshold value equal to the rise in the temperature of the at least one electronic device detected by the temperature sensor at which a magnitude relation between the power consumptions of the air conditioner and the power consumption of the fan is inverted according to a small or large rise in the temperature of the at least one electronic device detected by the temperature sensor.

2. The cooling system according to claim 1, further comprising:
    a power measuring apparatus configured to measure the power consumption of the fan, wherein the control apparatus updates the fan information based on the temperature detected by the temperature sensor and the power consumption measured by the power measuring apparatus.

3. The cooling system according to claim 1, wherein the control apparatus
    calculates a selection rule for selecting whether to increase the air volume or decrease the set temperature of the air conditioner or to increase the rotational speed of the fan, based on the air-conditioner information and the fan information, and
    controls the air volume or the set temperature of the air conditioner and the rotational speed of the fan based on the selection rule and the temperature detected by the temperature sensor.

4. The cooling system according to claim 3, wherein the control apparatus calculates an index value indicating operational efficiency of the at least one electronic device, based on the power consumption of the air conditioner and power consumption of the at least one electronic device, and adjusts the selection rule based on the index value.

5. A cooling method used in a system including an air conditioner capable of cooling a predetermined space and changing an air volume or a set temperature thereof and at least one electronic device disposed in the predetermined space and provided with a fan whose rotational speed is variable, the cooling method comprising:
    detecting a temperature of the at least one electronic device with use of a temperature sensor;
    accessing, by a processor, air-conditioner information indicating a relationship between cooling performance and power consumption of the air conditioner, and fan information indicating a relationship between cooling performance and power consumption of the fan; and
    controlling, by the processor, the air conditioner so as to increase the air volume or decrease the set temperature, or controlling the fan so as to increase the rotational speed, based on a rise in the temperature of the at least one electronic device detected by the temperature sensor, the accessed air-conditioner information and fan information, wherein
    the fan is controlled by the processor so as to increase the rotational speed when the rise in the temperature of the at least one electronic device detected by the temperature sensor is smaller than a threshold value, and the air conditioner is controlled by the processor so as to increase the air volume or decrease the set temperature when the rise in the temperature of the at least one electronic device detected by the temperature sensor is greater than or equal to the threshold value, and the threshold value is set by the processor to be equal to the rise in the temperature of the at least one electronic device detected by the temperature sensor at which a magnitude relation between the power consumption of the air conditioner and the power consumption of the fan is inverted according to a small or large rise in the temperature of the at least one electronic device detected by the temperature sensor.

6. A computer-readable storage medium storing a computer program used to control a system including an air conditioner capable of cooling a predetermined space and changing an air volume or a set temperature thereof and at least one electronic device disposed in the predetermined space and provided with a fan whose rotational speed is variable, the computer program causing a computer to perform a procedure comprising:

detecting a temperature of the at least one electronic device with use of a temperature sensor;

accessing air-conditioner information indicating a relationship between cooling performance and power consumption of the air conditioner and fan information indicating a relationship between cooling performance and power consumption of the fan; and controlling the air conditioner so as to increase the air volume or decrease the set temperature, or controlling the fan so as to increase the rotational speed, based on a rise in the temperature of the at least one electronic device detected by the temperature sensor, the accessed air-conditioner information and fan information, wherein the fan is controlled so as to increase the rotational speed when the rise in the temperature of the at least one electronic device detected by the temperature sensor is smaller than a threshold value, and the air conditioner is controlled so as to increase the air volume or decrease the set temperature when the rise in the temperature of the at least one electronic device detected by the temperature sensor is greater than or equal to the threshold value, and the threshold value is set to be equal to the rise in the temperature of the at least one electronic device detected by the temperature sensor at which a magnitude relation between the power consumptions of the air conditioner and the power consumption of the fan is inverted according to a small or large rise in the temperature of the at least one electronic device detected by the temperature sensor.

* * * * *